United States Patent
Stoeppelmann

(10) Patent No.: US 10,440,832 B2
(45) Date of Patent: Oct. 8, 2019

(54) PLASTIC MOLDING COMPOUND AND USE THEREOF

(71) Applicant: EMS-PATENT AG, Domat/Ems (CH)

(72) Inventor: Georg Stoeppelmann, Bonaduz (CH)

(73) Assignee: EMS-PATENT AG, Domat/Ems (CH)

( * ) Notice: Subject to any disclaimer, the term of this patent is extended or adjusted under 35 U.S.C. 154(b) by 380 days.

(21) Appl. No.: 15/037,418

(22) PCT Filed: Dec. 16, 2014

(86) PCT No.: PCT/EP2014/077910
§ 371 (c)(1),
(2) Date: May 18, 2016

(87) PCT Pub. No.: WO2015/091447
PCT Pub. Date: Jun. 25, 2015

(65) Prior Publication Data
US 2016/0295705 A1     Oct. 6, 2016

(30) Foreign Application Priority Data

Dec. 20, 2013   (EP) .................................. 13199146

(51) Int. Cl.
    *H05K 3/18*         (2006.01)
    *C08K 3/22*         (2006.01)
                (Continued)

(52) U.S. Cl.
CPC .............. *H05K 3/185* (2013.01); *C08K 3/22* (2013.01); *C08K 3/24* (2013.01); *C08K 7/14* (2013.01);
(Continued)

(58) Field of Classification Search
CPC ........ H05K 3/185; H05K 3/0014; C08K 3/22; C08K 3/24; C08K 7/14; C08L 77/00; C08L 77/04
See application file for complete search history.

(56) References Cited

U.S. PATENT DOCUMENTS

2014/0066560 A1*   3/2014   Stoeppelmann ........... C08K 7/14
                                                                      524/407

FOREIGN PATENT DOCUMENTS

DE          40 36 592 A1     5/1992
DE         101 53 922 A1     5/2003
(Continued)

OTHER PUBLICATIONS

English translation of an International Preliminary Report on Patentability dated Jun. 30, 2016 from the International Bureau issued in PCT/EP2014/077910.
(Continued)

*Primary Examiner* — John E Uselding
(74) *Attorney, Agent, or Firm* — Sughrue Mion, PLLC

(57) ABSTRACT

A method for producing a laser-structurable component, wherein an extruded single- or multilayer molded part with at least one laser-structurable layer that forms an exposed surface of the molded part is applied onto the surface of a non-laser-structurable support element. Alternatively, the at least one laser-structurable layer may be back-molded with a non-laser-structurable thermoplastic support element so that at least one laser-structurable layer of the molded part forms at least one part of the surface of the laser-structurable component. The extruded single- or multilayer molded part is deep-drawn into the component. In the process, the laser-structurable layer of the molded part consists of a thermoplastic molding compound consisting of: (A) 30-99.9 wt. % of a thermoplastic consisting of polyamide; (B) 0.1-10
(Continued)

wt. % of an LDS additive; and (C) 0-60 wt. % of an additive material which is different from (A) and (B).

13 Claims, 1 Drawing Sheet

(51) Int. Cl.
  *C08K 3/24* (2006.01)
  *C08K 7/14* (2006.01)
  *C08L 77/00* (2006.01)
  *H05K 3/00* (2006.01)
  *C08L 77/04* (2006.01)
  *C08L 77/06* (2006.01)
  *H05K 3/20* (2006.01)

(52) U.S. Cl.
  CPC .............. *C08L 77/00* (2013.01); *C08L 77/04* (2013.01); *C08L 77/06* (2013.01); *H05K 3/0014* (2013.01); *H05K 3/202* (2013.01); *C08K 2003/2248* (2013.01); *C08K 2003/2251* (2013.01); *H05K 2201/0129* (2013.01); *H05K 2203/107* (2013.01)

(56) References Cited

FOREIGN PATENT DOCUMENTS

| | | |
|---|---|---|
| DE | 10 2006 015 508 A1 | 10/2007 |
| DE | 10 2011 014 902 B3 | 2/2012 |
| EP | 1 274 288 A1 | 1/2003 |
| EP | 1 561 775 A2 | 8/2005 |
| EP | 1 987 707 A2 | 11/2008 |
| EP | 2 676 799 A1 | 12/2013 |
| EP | 2 703 435 A1 | 3/2014 |
| EP | 3 072 916 A1 | 9/2016 |
| TW | 201431919 A | 8/2014 |
| WO | 00/35259 A2 | 6/2000 |
| WO | 2012/128219 A1 | 9/2012 |
| WO | 2013/076314 A1 | 5/2013 |

OTHER PUBLICATIONS

International Search Report for PCT/EP2014/077910 dated Feb. 25, 2015 [PCT/ISA/210]

* cited by examiner

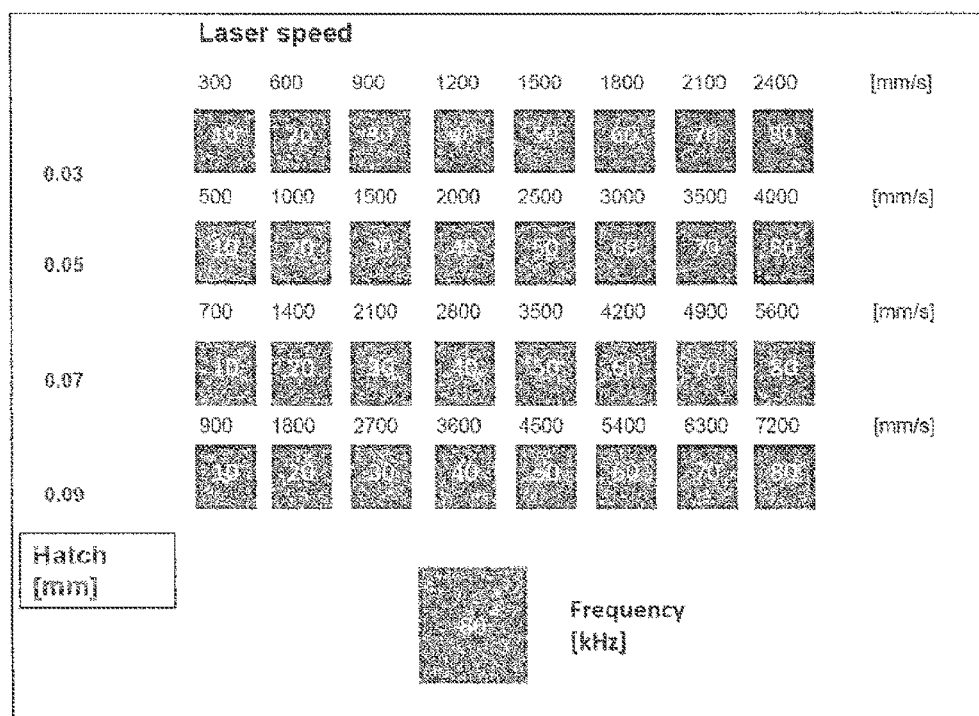

PLASTIC MOLDING COMPOUND AND USE THEREOF

CROSS REFERENCE TO RELATED APPLICATIONS

This application is a National Stage of International Application No. PCT/EP2014/077910, filed on Dec. 16, 2014, which claims priority from European Patent Application No. 13199146.5, filed on Dec. 20, 2013, the contents of all of which are incorporated herein by reference in their entirety.

TECHNICAL FIELD

The present invention relates to moldings produced by extrusion of thermoplastic molding compositions which in addition to plastic comprise LDS additives. The extruded moldings, more particularly foils, profiles, and hollow bodies, can be subjected, following partial irradiation, to targeted metallization. The present invention further relates to processes for using such extruded moldings in the form, for example, of single-layer or multilayer foils. The molding compositions of the invention find use in particular for the production of injection-molded and extruded, metallizable or metalized components.

PRIOR ART

Molded Interconnect Devices (MIDs)—circuit carriers produced from thermoplastics by injection molding—have the advantage over existing such devices of improved design freedom, of effective environmental compatibility, and of rationalization potential in relation to the process for producing the end product. The integration of electrical and mechanical functions into one injection molding may lead to miniaturization of the assembly. Moreover, entirely new functions can be realized, and virtually any desired forms can be designed. Two-component injection molding, hot stamping, and laser subtractive structuring are MID fabrication technologies that have already been in use in mass production for a number of years.

Likewise known, from EP-A-1 274 288, is the additive laser structuring technology, with which the molding produced by the standard injection molding process is structured by a laser. Through this technology, regions on the surface of the plastic that are later to carry the conduction tracks are partially seeded with metal atoms, atop which subsequently a metal layer grows in chemically reductive metalizing baths. The metal seeds come about by breakdown of metal compounds present in ultrafinely divided form in the carrier material.

WO 2013/076314 describes laser-direct-structurable thermoplastic molding compositions which comprise a tin-based mixed metal oxide as LDS additive, and demonstrates, using unreinforced injection-molded molding compositions of polycarbonate or polycarbonate/ABS mixtures, that these molding compositions possess high whiteness and that the metallization can be improved by raising the proportion of antimony oxide.

DE 101 53 922 A1 describes a process for producing an injection-molded interconnect device by in-mold coating a structured, nonmetallizable foil, in which recesses have been taken out for the planned conductor tracks, with a metallizable plastic and subsequently metalizing the in-mold-coated plastic in the regions recessed in the original foil and therefore now exposed in the metallizable plastic, where the conductor tracks are to be formed.

DE 40 36 592 A1 claims injection-molded conductor tracks which have been obtained by in-mold-coating of flexible circuits with thermoplastics. In order to make the flexible carrier foils metallizable exclusively at the planned locations where the conductors are to be formed, they are treated locally with a screen printing paste which contains a metallization activator. The carrier foil provided with completed conductor tracks is then in-mold-coated with a thermoplastic, in order to give the desired three-dimensional interconnect device.

DE 10 2011 014 902 B3 relates to a process for producing an antenna component with a three-dimensional antenna. The antenna, a defined conductor track produced by application of an electrically conductive varnish, is located on a thermoplastic carrier foil which is curved in one or more curvature regions in a desired way by thermoforming.

EP 1 987 707 A2 presents a method for generating an electrically conductive layer on a shaped body, in which a formable foil of thermoplastics is first of all provided, at the locations where the conductor tracks are to be formed, with seeds that have electroplating catalytic activity, after which this foil is formed into a three-dimensional shaped body by thermoforming and, in a final step, is metalized.

DE 10 2006 015 508 describes multilayer, uniaxially oriented thermoplastic polyester foils consisting of a base layer and at least one top layer, said foils including 0.5-15 percent by weight of a metal compound which can be activated by electromagnetic radiation. Only pure polyester layers are employed; there is a reference to the admixing of other polymers, but an upper limit of 45 percent by weight is imposed on their proportion.

EP 1 561 775 likewise describes uniaxially oriented thermoplastic polymer foils with 0.5-15 percent by weight of a metal compound which can be activated by electromagnetic radiation. Exclusively systems with a polyamide fraction of at most 18 percent by weight are employed.

EXPOSITION OF THE INVENTION

The thermal and mechanical properties and also the associated fields of use of these known MID circuit carriers are determined primarily by the thermoplastic molding composition on which they are based. Polyamides as molding compositions are nowadays widespread as structural elements for the interior and exterior, a fact attributable substantially to the outstanding mechanical properties.

The laser-direct-structurable molding compositions comprise what are known as laser additives, which release metals on exposure to electromagnetic radiation. Frequently employed for this laser-induced seeding are metal oxides, more particularly spinels. To increase the microroughness and therefore the adhesion of the subsequently applied conductor track, such molding compositions may further comprise considerable amounts of additional fillers, such as talc. As a result of the addition of particulate fillers or white pigments to the molding compositions, however, there is generally a distinct impairment of the mechanical properties and the extrusion properties, with reductions more particularly in the tensile strength, the elongation at break, and the impact strength.

In the case of the customary procedures in MID technology using laser structuring (LDS), therefore, the procedure for producing the conductor tracks in a first step (the second step then being the downstream electroless deposition of the actual conductors) is always that a component is injection-molded from a material which as a whole, in the mass, includes specific laser-activatable metal compounds. Although, in accordance with their function, these metal compounds would have to be present necessarily only in the topmost layer of the interconnect device, they are consequently distributed throughout the molded article, and they also adversely affect the physical properties, in some cases considerably so.

All other aforementioned methods from the prior art for forming conductor tracks all consistently involve first the templating of the conductor topology on a foil, for example, either by cutting of the foil or by printing of the foil or similar, after which this foil is in-mold-coated or formed. In this process, accordingly, the topology of the conductors is templated always on the precursor product itself, after which processing of said precursor product continues to give the component.

A disadvantage associated with this is, in particular, that during the processing of the precursor product it is necessary to ensure exact maintenance of the topology, something which is not always possible.

The present invention takes an entirely new path.

On this basis, it was an object of the present invention to provide suitable thermoplastic polyamide molding compositions, and especially those which are laser-direct-structurable, with which it is possible to produce extruded molded articles, more particularly foils, or multilayer foils, having good mechanical properties, more particularly having high flexibility, high tensile strength and high elongation at break, and high toughness. The intention, furthermore, is that the molded articles, foils, and foil-coated molded articles are to be readily metallizable after laser irradiation, and the conductor tracks are to adhere well to the thermoplastic substrate, more particularly to the polyamide substrate. The provision of flexible foils which can be equipped with conductor tracks on the finished component, and not as early on the precursor product, and also the provision of foils carrying single-layer and multilayer conductor tracks, as a finished component, extend the MID to the EID (Extruded Interconnect Device) technology. The foils of the invention may also be in-mold-coated with thermoplastics. The intention, moreover, is that foils produced from the material, especially in the case of preferred embodiments, should have high planarity, not only after production but also after laser structuring and/or after metallization.

The present invention therefore embraces on the one hand a process for producing a laser-structurable component, as for example a circuit board, a casing for an electronic device, etc., and on the other hand components produced in this way, and also moldings with an LDS additive which are particularly suitable especially for the production of such components.

At the core of the invention, among other things, is the finding that it is easily possible, unexpectedly, to dispose the laser structurability properties of a component only in the surface layer and hence on the one hand largely to rule out for the entire component disadvantages to the physical properties that are caused by modifications to the material that are necessary for the laser structurability—specifically, the presence of the LDS additive—and to use these additions only in exactly the required extent and in exactly the required amount, namely only in the required surface region, and nevertheless to provide outstanding adhesion between the ultimately formed conductor tracks and the carrier.

A first subject of the present invention is therefore a process for producing a laser-structurable component, a process characterized in that an extruded, single-layer or multilayer molding having at least one laser-structurable layer that forms an exposed surface of the molding is applied to the surface of a non-laser-structurable carrier element (or extrusion is carried out, followed by introduction and application), or is in-mold-coated with a non-laser-structurable thermoplastic carrier element, so that at least one laser-structurable layer of the molding, preferably without having already formed conductor tracks, forms at least one part of the surface of the laser-structurable component, or that the extruded, single-layer or multilayer molding is thermoformed to form the component, preferably without already having formed conductor tracks (or extrusion is carried out, followed by introduction and thermoforming). The laser-structurable layer of the molding here consists substantially over its entire area of a thermoplastic molding composition comprising:

(A) 30-99.9 wt % of thermoplastic preferably consisting of polyamide (A1) or of a mixture of a polyamide (A1) and another thermoplastic (A2), the fraction of polyamide (A1) being at least 70 wt %, based on the sum of (A1) and (A2);
(B) 0.1-10 wt % of LDS additive;
(C) 0-60 wt % of adjuvants different from (A) and (B);
the sum of (A)-(C) making 100 wt %.

Preferentially here the laser-structured layer is unoriented and/or else not heat-set, meaning that it is preferentially the result of an extrusion, casting or coating operation without subsequent drawing, whether uniaxial or multiaxial, or heat treatment, at a temperature of 200-250° C., for example. With further preference the thermoplastic (A) is free from polyester constituents.

For the thermoplastic molding composition of the invention, the thermoplastic molten state is attained by melting at temperatures above the melting point or above the glass transition temperature. The viscous melt is shaped usually on screw machines (extruders) in a kind of casting operation. In extrusion, the melt is processed continuously through profile dies (tooling) to form precursor products. In the case of injection molding, as a discontinuous process, the melt is introduced rapidly and at high pressure into the closed mold, forming injection moldings. The difference between the two processing techniques is that injection molding results in a finished product whereas extrusion only forms precursor products. Furthermore, injection molding is a discontinuous process, where the conveying screw acts as a piston, something which is not the case with extrusion. On account of these differences, extrusion has a number of advantages over injection molding in relation to the completed molding, since the extrusion-manufactured moldings possess physical properties different to those of the injection moldings, in terms, namely, of stress freedom, warping, flatness, drawability, orientability, flexibility, radii of flexure, minimal wall thickness, etc.—more specifically, for example:

extruded moldings are stress-free moldings, with little or no warping and high flatness;
extruded moldings may take the form of thin parts, especially thin parts of large surface area;
extruded foils are drawable and orientable;
extruded moldings, especially foils, have a high flexibility and tolerate small radii of flexure
extruded pipe sections or profiles are free from skewing
extrusion provides long profiles and pipes without connecting seams, having, in particular, two or more layers or low layer wall thicknesses.

In one preferred embodiment of the process, the molding is a profile, a pipe, a film or a foil, preferably a film or a foil, these moldings having at least one laser-structurable layer of the invention which in the case of single-layer construction of the molding forms the molding as a whole on its own, and this layer preferably has a thickness in the range of 10-1000 micrometers, preferably in the range of 20-600, more particularly 30-400 or 40-300 micrometers, and the film or foil further preferably being formed by the laser-structurable layer alone, or having one or more carrier layers which are different from the laser-structurable layer and on which film or foil are disposed on one or both sides, forming the surface. One preferred embodiment relates to a shaped article comprising at least two layers, especially preferably exactly two layers, the shaped article possibly being in the form of a pipe, profile or foil and there being a plurality of or, preferably, precisely one further carrier layer(s) (T) present in addition to the laser-structurable layer (S). It is further preferred if the thickness ratio of layer S to layer T is at least 1:2, preferably at least 1:10, preferably in the range from 1:2 to 1:100 or 1:1000. It is advantageous in this case if the layer S is given an extremely thin configuration, thus having a thickness of preferably 10-100 μm, more preferably of 10-50 μm. The layer T in this case has a thickness of 20-1000 μm, preferably of 50-500 μm. To ensure very good laser structuring and subsequent metallization, and also adequate adhesion of the electrolessly applied metal layer, the concentration of the LDS additive in the layer S in the case of this embodiment of the molding is set advantageously at a relatively high level, without overall using more LDS additive for the overall component, comprising at least one layer S and at least one layer T. Preferentially the fraction of the LDS additive (B) in the layer S is at least 2, preferably at least 4, especially preferably at least 5 wt %, based on the overall molding composition which forms the layer S. The LDS additive fraction in the layer S is therefore preferably in the range of 4-10, more particularly in the range of 5-10 wt %.

There are various ways in which the molding can be applied to the carrier element. For instance it is possible for the molding to be adhered (using an adhesion promoter), laminated (with or without adhesion promoter) or lined onto the surface of the carrier element, in each case preferably with application of pressure and/or heat; crosslinking is a possible option as well.

Alternatively, the molding or the laser-structurable layer (S) may also be extruded directly from the molten state onto the carrier element (carrier layer (T)) in a coextrusion or multilayer extrusion with or without interposition of an adhesion promoter layer—for foils, preferably using a slot die, in the form of a coherent film on the surface of the carrier element. Accordingly in situ it is possible to produce a particularly good bond to the carrier element, and it is also possible, for example, for carrier elements composed of entirely different materials to be coated, as for example those composed of thermosets, or materials which are fundamentally entirely different, such as wood, textiles, metals, etc.

In an in-mold process, the molding can also be introduced as a foil in a mold and coated by injection molding, with the carrier element in that case being formed from the in-mold-coated material. Another embodiment thus constitutes the in-mold-coating of the foil of the invention, comprising the laser-structurable layer with a thermoplastic, in which case the foil may already carry conductor tracks on at least one side or may be provided on its surface with conductor tracks in a downstream step.

As stated, it is likewise possible to operate without a carrier element, and to bring the molding as a whole into the desired form, in a forming or thermoforming operation, for example. In that case the laser-structurable layer acquires a three-dimensional structure by forming, more particularly by thermoforming.

The carrier element and/or in particular the molding here consist/consists, according to one preferred embodiment, of a polyamide-containing plastic, preferably of aliphatic polyamides, semiaromatic, semicrystalline polyamides (e.g., polyphthalamides), amorphous cycloaliphatic or semiaromatic polyamides, or mixtures of these polyamides. Preferred are mixtures of aliphatic polyamides (A1_1) and amorphous polyamides (A1_2), or mixtures of semiaromatic, semicrystalline polyamides with amorphous polyamides.

In a subsequent processing step, according to a further preferred embodiment, it is possible then for conductor tracks to be formed on the component and/or on the layer (S) by laser direct structuring and subsequent electroless and optionally additional electroplating deposition of metals on the component, and also, optionally, for electrical and/or electronic components to be incorporated subsequently, and also for further steps to follow, such as, for example, assembly, etc. Correspondingly the present invention also relates, furthermore, to a component produced or producible by a process as described above, prepared for or having electrical conductor tracks, preferably as carrier element, circuit board, casing or casing part for electronic devices, more particularly portable electronic devices, such as especially PDAs, mobile telephones, telecommunications devices, carrier elements, circuit boards, casings or casing parts for personal computers, notebook computers, medical devices, such as especially hearing devices, sensor technology, or RFID transponders or parts for the automotive sector, such as especially airbag module, multi-function steering wheel.

The components are therefore constructed on the basis of an extruded molding comprising a layer (S) produced from a molding composition as set out later on below. Fields of use for such components and for the MID technology are automotive engineering, industrial automation, medical technology, the domestic appliance industry, consumer electronics, telecommunications engineering, metrology and analysis, mechanical engineering, and also aerospace. The invention hence also relates to an article, more particularly an interconnect device, comprising a molding comprising the layer (S) composed of the molding composition of the invention. In one embodiment the interconnect device is utilized in order to form an antenna.

Examples of such moldings are casings or casing parts for portable electronic devices, such as PDAs, mobile telephones, other telecommunications devices, flexible mobile telephone casings or parts, foils or parts for thin-film batteries, casings or casing parts for personal computers, notebook computers, medical devices, such as hearing devices, sensor technology, or RFID (Radio Frequency IDentification) transponders, or parts for the automotive sector, such as airbag module, multi-function steering wheel, for example, or else metalized or metallizable foils for decorative purposes.

On the basis of the physical properties it is possible to produce three-dimensional interconnect devices. Furthermore, typical mechanical functions can be integrated, such as mounts, guides, buttons, plugs or other connecting elements. Likewise possible are connectors for electrics/electronics and for fuel systems. The invention further relates to flexible molded articles, more particularly foils, which carry conductor tracks or metal structures, these articles possessing a high flexibility, in contrast to the injection-molded components, with the consequence that a foil, for example, comprising the layer (S) can be rolled up into a roll having a diameter of less than 10 mm—that is, a low radius of flexure is possible—without the conductor tracks or metal structures becoming detached and/or being damaged.

The present invention relates, moreover, to an extruded, single-layer or multilayer molding, preferably for use in a process as set out above, or for use in a component as set out above, or an extrusion process for producing such a molding, having at least one laser-structurable layer (S) which forms an exposed surface of the molding, consisting substantially over its entire area of a thermoplastic molding composition comprising:

(A) 30-99.9 wt % of thermoplastic, preferably consisting of polyamide (A1) or of a mixture of polyamide (A1) and another thermoplastic (A2), the fraction of polyamide (A1) being at least 70 wt %, based on the sum of (A1) and (A2), and preferably (A1) is a cycloaliphatic amorphous polyamide (A1_4) or a mixture of aliphatic polyamides (A1_1) and semiaromatic, semicrystalline polyamides (A1_2), amorphous semiaromatic polyamides (A1_3) and/or amorphous cycloaliphatic polyamides (A1_4);

(B) 0.1-10 wt % of LDS additive;

(C) 0-60 wt % of adjuvants different from (A) and (B);

where the sum of (A)-(C) is 100 wt %, and where a layer of this kind in the process is produced in an extrusion process.

A molding of this kind is preferentially characterized in that it is a profile, a pipe, a film, or a foil, preferably a film or a foil, the film or foil preferably having a thickness in the range of 10-1000 micrometers, preferably in the range of 20-600 micrometers, more particularly in the range of 30-400 or 40-300, and where, moreover, preferably the film or foil is formed by the laser-structurable layer (S) alone, or has one or more carrier layers (layers ($T_i$)) different from the laser-structurable layer, the film or foil being disposed on one or both sides of these layers, forming the surface, and in that case preferably these surface layers on carrier layer have a thickness in the range of 10-250 µm, preferably in the range of 20-150 micrometers.

The molding composition of the invention consists with regard to component (A) preferably of 30 to 99.9 wt %, preferably of 42 to 99 wt %, more preferably 44 to 98 wt %, of a thermoplastic (A) preferably selected from the group consisting of the following: polycarbonate, polyphenylene ether, polystyrene, polymethyl methacrylate, acrylonitrile-butadiene-styrene copolymer, acrylonitrile-styrene copolymer, polyolefin, modified polyolefins, especially grafted polyolefins, polyoxymethylene, polyesters, especially polyethylene terephthalate, polybutylene terephthalate, polysulfone (especially of type PSU, PESU, PPSU), polyphenylene sulfide, liquid-crystalline polymers, polyetherketone, polyetheretherketone, polyamide, polyimide, polyamideimide, polyesterimide, polyetheramide, polyesteramide, polyetheresteramide, polyurethane (especially of type TPU, PUR), polysiloxane, polyacrylate, polymethacrylate, and also mixtures or copolymers based on such systems.

Especially preferably component (A) comprises polyamide (A1), and preferably component (A) consists of at least 50 wt % of polyamide (A1), more preferably of at least 70 wt % or 80 wt % of polyamide (A1), the remainder being formed by another thermoplastic (A2).

According to one particularly preferred embodiment, component (A) consists exclusively of polyamide (A1). According to a first preferred embodiment, component (A), as well as other thermoplastics (A2), consists of polyamides (A1) selected from the group consisting of the following: aliphatic polyamides (A1_1), semiaromatic, semicrystalline polyamides (polyphthalamides and araliphatic polyamides) (A1_2), semiaromatic amorphous polyamides (A1_3) and/or cycloaliphatic amorphous polyamides (A1_4) in a concentration of at least 40 wt %, preferably in a range of 50-100 wt %, in relation to the total amount of component (A).

Preferentially component (A) consists exclusively of the stated polyamides (A1_1) to (A1_4).

In a further embodiment, component (A1) is preferentially a mixture of aliphatic polyamides (A1_1) and amorphous polyamides (A1_3) and/or (A1_4), in which case preferably the amount of component (A1_1) is in the range from 40 to 95 wt % and the amount of the sum of components (A1_3) and/or (A1_4) is in a range of 5-60 wt % in relation to the total amount of component (A1).

According to a further preferred embodiment, the polyamide (A1) consists of at least one amorphous or microcrystalline polyamide based on cycloaliphatic diamines (A1_4) and optionally further polyamides, preferentially selected from the group of the semicrystalline, aliphatic polyamides (A1_1) or semicrystalline, semiaromatic polyamides (A1_2). With further preference the polyamide (A1), according to a further preferred embodiment, consists of 20-100 wt %, preferably 30-90 or 35-80 wt %, of amorphous cycloaliphatic polyamide (A1_4) and of 0-80 wt %, preferably 10-70 or 20-65 wt %, of aliphatic polyamide (A1_1) and/or semicrystalline, semiaromatic polyamide (A1_2).

Component (A2) is different from (A1) and may be selected from the group consisting of the following: polycarbonate, polystyrene, polymethyl methacrylate, acrylonitrile-butadiene-styrene copolymer, acrylonitrile-styrene copolymer, polyolefin, polyoxymethylene, polyesters, especially polyethylene terephthalate, polybutylene terephthalate, polysulfone, especially of type PSU, PESU, PPSU, polyphenylene ethers, polyphenylene sulfide, polyphenylene oxide, liquid-crystalline polymers, polyetherketone, polyetheretherketone, polyimide, polyamideimide, polyesterimide, polyetheramide, polyesteramide, polyetheresteramide, polyurethane, especially of type TPU, PUR, polysiloxane, polyacrylate, polymethacrylate, and also mixtures or copolymers based on such systems. Aliphatic polyamides of component (A1_1) are purely aliphatic polyamides, meaning that this term excludes cycloaliphatic polyamides as defined in the context of component (A1_4). The aliphatic polyamide of component (A1_1) is generally a polyamide constructed from saturated linear or branched lactams and/or saturated linear or branched amino acids having in each case 6-12 carbon atoms, and/or from saturated linear or branched dicarboxylic acids having 6-18, preferably having 6-12 carbon atoms, and saturated linear or branched diamines having 4-12 carbon atoms, or, respectively, copolyamides constructed from these units.

The aliphatic polyamides of component (A1_1) are preferably polyamides selected from the following group: polyamide 46, polyamide 6, polyamide 66, polyamide 11, polyamide 12, polyamide 1212, polyamide 1010, polyamide 1012, polyamide 1112, polyamide 610, polyamide 106, polyamide 612, polyamide 69, polyamide 810 or their copolyamides, mixtures, blends or alloys used. The aliphatic polyamide (A1) here preferably possesses a solution viscosity $\eta_{rel}$, measured in m-cresol (0.5 wt %, 20° C.), in the range from 1.5 to 3.0, preferably in the range from 1.6 to 2.6, more particularly in the range from 1.7 to 2.3.

It is preferred, moreover, if the aliphatic polyamide (A1_1) has a methylene/amide ratio of at least 5 and more particularly of at least 7, with the ratio being situated preferably in the range from 5 to 12, more preferably in the range of 7-12. It is especially preferred for component (A1_1) to be selected from the group consisting of polyamide PA610, PA106, PA1010, PA1012, PA 1212, PA11 or PA12.

Component (A1_2) comprises semicrystalline, semiaromatic polyamides, comprising polyphthalamides, based on terephthalic acid, and araliphatic polyamides, based on xylylenediamine (para- or meta-). Examples of araliphatic polyamides are MXD6-18 (MXD=meta-xylylenediamine), with MXD6 and MXD10 being preferred. Preferred for use as A1_2 are polyphthalamides which preferentially possess a glass transition temperature in the range from 90 to 140° C., preferably in the range from 110 to 140° C., and more particularly in the range from 115 to 135° C. The melting point of the polyamide (A1_2) is in the range from 255 to 330° C., preferably in the range from 270 to 325° C., and more particularly in the range from 280 to 320° C. The semicrystalline, semiaromatic polyamides of the component preferably possess enthalpies of fusion determined by DSC (ISO standard 11357-11-2) in the range from 25 to 80 J/g, more preferably in the range from 30 to 70 J/g.

Preferred semiaromatic, semicrystalline polyamides here are prepared from
a) 30 to 100 mol %, more particularly 50 to 100 mol %, of terephthalic acid and/or naphthalenedicarboxylic acid and also 0 to 70 mol %, more particularly 0 to 50 mol %, of at least one aliphatic dicarboxylic acid having 6 to 18, preferably 6 to 12 carbon atoms, and/or 0 to 70 mol %, more particularly 0 to 50 mol %, of at least one cycloaliphatic dicarboxylic acid having 8 to 20 carbon atoms, and/or 0 to 50 mol % of isophthalic acid, based on the total amount of the dicarboxylic acids,
b) 80 to 100 mol % of at least one aliphatic diamine having 4-18 carbon atoms, preferably having 6 to 12 carbon atoms, and also 0 to 20 mol % of at least one cycloaliphatic diamine, preferably having 6 to 20 carbon atoms, such as PACM, MACM, IPDA, for example, and/or 0 to 20 mol % of at least one araliphatic diamine, such as MXDA and PXDA, for example, based on the total amount of the diamines, and also optionally
c) aminocarboxylic acids and/or lactams each having 6 to 12 carbon atoms.

According to one preferred embodiment, the semiaromatic polyamide of component (A1_2) here is formed on the basis of at least 55 mol %, more particularly of at least 65 mol %, of terephthalic acid and at least 80 mol %, preferably at least 90 mol %, more particularly at least 95 mol % of aliphatic diamines having 4 to 18 carbon atoms, preferably having 6-12 carbon atoms, and optionally further aliphatic, cycloaliphatic, and aromatic dicarboxylic acids and also lactams and/or aminocarboxylic acids. Further aromatic dicarboxylic acids which can be used, apart from terephthalic acid, are isophthalic acid and naphthalenedicarboxylic acid. Suitable aliphatic and cycloaliphatic dicarboxylic acids which can be used as well as terephthalic acid possess 6 to 36 carbon atoms and are employed in a fraction of at most 70 mol %, more particularly in a fraction of at most 50 mol %, based on the total amount of the dicarboxylic acids.

It is preferred, moreover, for the stated aromatic dicarboxylic acids of the semiaromatic polyamide of component (A1_2) to be selected from the following group: terephthalic acid, isophthalic acid, and mixtures thereof.

According to a further preferred embodiment, the stated—for example—aliphatic dicarboxylic acids of the semiaromatic polyamide of component (A1_2) that can be used apart from terephthalic acid are selected from the group of adipic acid, suberic acid, azelaic acid, sebacic acid, undecanedioic acid, dodecanedioic acid, brassylic acid, tetradecanedioic acid, pentadecanedioic acid, hexadecanedioic acid, octadecanedioic acid, and dimer fatty acid (C36). Particular preference is given to adipic acid, sebacic acid, and dodecanedioic acid.

Dicarboxylic acids which are preferably used apart from terephthalic acid are accordingly: isophthalic acid, adipic acid, sebacic acid, and dodecanedioic acid, or a mixture of such dicarboxylic acids. Particular preference is given to polyamides (A1_2) based exclusively on terephthalic acid as dicarboxylic acid. According to a further preferred embodiment, the stated aliphatic diamines of the semiaromatic polyamide of component (A1_2) are selected from the group of 1,4-butanediamine, 1,5-pentanediamine, 1,6-hexanediamine, 1,7-heptanediamine, 1,8-octanediamine, 1,9-nonanediamine, methyl-1,8-octanediamine, 1,10-decanediamine, 1,11-undecanediamine, 1,12-dodecanediamine, or a mixture of such diamines, with preference being given to 1,6-hexanediamine, 1,10-decanediamine, 1,12-dodecanediamine, or a mixture of such diamines, and particular preference to 1,6-hexanediamine and 1,10-decanediamine. Besides the aliphatic diamines, it is possible for cycloaliphatic and/or araliphatic diamines to be used, in a concentration of 0 to 20 mol %, based on the total amount of diamines. With particular preference the high-melting polyamides are formed from the following components:
a) (A1_2a): Dicarboxylic acids: 50-100 mol % of aromatic terephthalic acid and/or naphthalenedicarboxylic acid, based on the total amount of dicarboxylic acids present, 0-50 mol % of an aliphatic dicarboxylic acid, preferably having 6 to 12 carbon atoms, and/or of a cycloaliphatic dicarboxylic acid having preferably 8 to 20 carbon atoms, and/or isophthalic acid;
b) (A1_2b): Diamines: 80-100 mol % of at least one aliphatic diamine having 4-18 carbon atoms, preferably having 6 to 12 carbon atoms, based on the total amount of diamines present, 0-20 mol % of cycloaliphatic diamines, preferably having 6 to 20 carbon atoms, such as PACM, MACM, IP-DA, for example, and/or araliphatic diamines, such as MXDA and PXDA, for example, the percentage molar amount of dicarboxylic acids making 100% and the percentage molar amount of diamines making 100% in the high-melting polyamides, and optionally from:
c) (A1_2c): Aminocarboxylic acids and/or lactams, comprising lactams having preferably 6 to 12 carbon atoms, and/or aminocarboxylic acids having preferably 6 to 12 carbon atoms.

Whereas components (A1_2a) and (A1_2b) are used largely equimolarly, the concentration of (A1_2c) is preferably not more than 20 wt %, more preferably not more than 15 wt %, more particularly not more than 12 wt %, based in each case on the sum of (A1_2a) to (A1_2c).

Additionally to the largely equimolarly employed components (A1_2a) and (A1_2b), it is possible to use dicarboxylic acids (A1_2a) or diamines (A1_2b) to regulate the molar mass or to compensate losses of monomer during polyamide production, meaning that in its entirety the concentration of a component (A1_2a) or (A1_2b) may predominate.

Suitable cycloaliphatic dicarboxylic acids are the cis- and/or trans-cyclohexane-1,4-dicarboxylic acid and/or cis- and/or trans-cyclohexane-1,3-dicarboxylic acid (CHDA).

The abovementioned aliphatic diamines that are generally used may be replaced in a minor amount of not more than 20 mol %, of preferably not more than 15 mol % and more particularly not more than 10 mol %, based on the total amount of the diamines, by other diamines. As cycloaliphatic diamines it is possible for example to use cyclohexanediamine, 1,3-bis(aminomethyl)cyclohexane (BAC), isophoronediamine, norbornanedimethylamine, 4,4'-diaminodicyclohexylmethane (PACM), 2,2-(4,4'-diaminodicyclohexyl)propane (PACP), and 3,3'-dimethyl-4,4'-diaminodicyclohexylmethane (MACM). Araliphatic diamines that may be mentioned include m-xylylenediamine (MXDA) and p-xylylenediamine (PXDA). Additionally to the dicarboxylic acids and diamines described it is possible to use, as well, lactams and/or aminocarboxylic acids as polyamide-forming components (component (A1_2c)). Suitable compounds are, for example, caprolactam (CL), α,ω-aminocaproic acid, α,ω-aminononanoic acid, α,ω-aminoundecanoic acid (AUA), laurolactam (LL), and α,ω-aminododecanoic acid (ADA). The concentration of the aminocarboxylic acids and/or lactams used together with the components (A1_2a) and (A1_2b) is not more than 20 wt %, preferably not more than 15 wt %, and more preferably not more than 12 wt %, based on the sum of the components (A1_2a) to (A1_2c). Especially preferred are lactams and/or α,ω-amino acids having 4, 6, 7, 8, 11 or 12 C atoms. These are the lactams pyrrolidin-2-one (4 C atoms), ε-caprolactam (6 C atoms), enantholactam (7 C atoms), caprylolactam (8 C atoms), laurolactam (12 C atoms), and, respectively, the α,ω-amino acids 1,4-aminobutanoic acid, 1,6-aminohexanoic acid, 1,7-aminoheptanoic acid, 1,8-aminooctanoic acid, 1,11-aminoundecanoic acid, and 1,12-aminododecanoic acid. In one particularly preferred embodiment, component A1_1 is free from caprolactam and/or aminocaproic acid.

In order to regulate the molar mass, the relative viscosity and/or the fluidity or the MVR it is possible to admix the batch and/or the precondensate (prior to the postcondensation) with chain transfer agents in the form of monocarboxylic acids or monoamines.

Specific representatives of the polyamides (A1_2) of the invention are as follows: PA 4T/4I, PA 4T/6I, PA 5T/5I, PA 6T/6, PA 6T/6I, PA 6T/6I/6, PA 6T/66, 6T/610, 6T/612, PA 6T/10T, PA 6T/10I, PA 9T, PA 10T, PA 12T, PA 10T/10I, PA10T/106, PA10T/12, PA10T/11, PA 6T/9T, PA 6T/12T, PA 6T/10T/6I, PA 6T/6I/6, PA 6T/6I/12, and mixtures thereof;
with more particular preference the semiaromatic polyamide of component (A1_2) is selected from the following group: PA 6T/6I, PA 6T/10T, PA 6T/10T/6I, and mixtures thereof. Preferred polyamides (A1_1) comprise 6T units, more particularly at least 10 wt % of 6T units.

The semiaromatic, semicrystalline polyamide (A1_2) has a solution viscosity $\eta_{rel}$, (determined according to DIN EN ISO 307, 0.5 wt % in m-cresol, 20° C.) of not more than 2.6, preferably not more than 2.3, more particularly not more than 2.0. Preferred polyamides (A1) have a solution viscosity $\eta_{rel}$ in the range from 1.45 to 2.3, more particularly in the range from 1.5 to 2.0 or 1.5 to 1.8.

The polyamides (A1_2) of the invention can be prepared on typical polycondensation lines via the operating sequence of precondensation and postcondensation. For the polycondensation, the chain transfer agents described are used preferably for regulating the viscosity. The viscosity may additionally be adjusted through the use of an excess of diamine or of dicarboxylic acid.

Component (A1_3): For the polyamides A1_3, the copolyamides 6I/6T, 10I/10T, 12/6T, MXD6/MXDI are preferred. Also possible are systems of the type MXDI, MXDI/6I, MXD6/MXDI. Particularly preferred are the amorphous copolyamides 6I/6T, 10I/10T and 12/6T with a fraction of less than 50 mol % of 6T units. Preference is given in particular to PA 6I/6T and PA 10I/10T, where a compositional range T:I (T stands for terephthalic acid, I for isophthalic acid) from 20:80 to 45:55 is preferred. With regard to the MXD6/MXDI copolyamides, MXD6 rich compositions are preferred, especially those with an MXD6 content of greater than 80 mol %, more preferably in the range from 82 to 95 mol %. With particular preference component (A1_3) is selected as polyamide PA 10I/10T with an I:T ratio in the range from 75:25 to 50:50, preferably in the range from 70:30 to 55:45, and more particularly of 60:40. In comparison to the PA 6I/6T copolyamide, PA 10I/10T significantly reduces the contraction transverse to the direction of injecting (from 0.3% to 0.1%).

Component (A1_4) is preferentially an amorphous or microcrystalline polyamide based on cycloaliphatic and optionally additionally aliphatic diamines, aliphatic, cycloaliphatic or aromatic dicarboxylic acids, lactams and/or aminocarboxylic acids, preferably having 6 to 40, especially preferably 6-36, carbon atoms, or is a mixture of such homopolyamides and/or copolyamides. Examples of suitable cycloaliphatic diamines are bis(4-amino-3-methylcyclohexyl)methane (MACM), bis(4-amino-3-ethylcyclohexyl)methane (EACM), bis(4-amino-3,5-dimethylcyclohexyl)methane (TMDC), isophoronediamine (IPD), 1,3-bis(aminomethyl)cyclohexane (BAC) and/or bis(4-aminocyclohexyl)methane (PACM), with or without additional substituents, especially alkyl substituents. The aliphatic dicarboxylic acid may further be an aliphatic dicarboxylic acid having 2-36, preferably 6-20 carbon atoms in linear or branched disposition, especially preferably having 10, 12, 14, 16 or 18 carbon atoms.

According to a further preferred embodiment, the polyamide (A1_4) is a homopolyamide or copolyamide selected from the group of MACM9, MACM10, MACM12, MACM14, MACM16, MACM18, PACM12, PACM14, PACM16, PACM18, MACM12/PACM12, MACM14/PACM14, MACM16/PACM16, MACM18/PACM18, PACM9-18, MACMI/12, 6I/6T/MACMI/MACMT/12, 6I/MACMI/MACMT, 6I/PACMI/PACMT, MACMI/MACMT/12, 6I/6T/MACMI, MACMI/MACM36, 12/PACMI or 12/MACMT, 6I/PACMT, 6/IPDT, BACI/BACT, MACM12/BAC12, 10I/10T/BACI/BACT, or a mixture of such polyamides. Particularly preferred polyamides (A1_4) are MACM12, MACM14, MACM18, PACM12/MACM12, MACMI/12 and MACMI/MACMT/12. Polyamide (A1_4), especially in the form of an amorphous or microcrystalline homopolyamide and/or copolyamide, preferentially possesses a solution viscosity (ηrel) of between 1.3 and 2.0, especially preferably between 1.40 and 1.85, and/or a glass transition temperature Tg of more than 90° C., preferably more than 110° C., especially preferably more than 130° C. It is preferred, furthermore, if the polyamide (A1_4) is a microcrystalline polyamide having an enthalpy of fusion in the range of 4-40 J/g, more particularly in the range of 4-25 J/g.

In one especially preferred embodiment, the polyamide (A1_4) comprises MACM12-18 and/or MACMI/12 and/or MACMI/MACMT/12.

Component (A1_4) comprises amorphous or microcrystalline polyamides which preferentially possess a glass transition temperature in the range from 90 to 180° C., preferably in the range from 110 to 170° C., and more particularly in the range from 115 to 165° C., and are formed preferably from
a) 60 to 100 mol %, more particularly 80 to 100 mol %, of at least one aliphatic and/or aromatic dicarboxylic acid having 6 to 14 or 6 to 12 carbon atoms, and also 0 to 40 mol %, more particularly 0 to 20 mol %, of at least one cycloaliphatic dicarboxylic acid having 8 to 20 carbon atoms, based on the total amount of the dicarboxylic acids;
b) 50 to 100 mol %, preferably 70 to 100 mol %, more preferably 85 to 100 mol % of at least one cycloaliphatic diamine, preferably having 6 to 20 carbon atoms, such as PACM, MACM, EACM, TMDC, BAC and IPDA, for example, and also 0 to 50 mol %, preferably 0-30 mol %, more preferably 0-15 mol % of at least one aliphatic diamine, having 4-18 carbon atoms, preferably having 6 to 12 carbon atoms, and/or 0 to 100 mol % of at least one araliphatic diamine, such as MXDA (meta-xylylenediamine) and PXDA (para-xylylenediamine), for example, based on the total amount of the diamines, and also optionally;
c) aminocarboxylic acids and/or lactams each having 6 to 12 carbon atoms.

According to one preferred embodiment, the polyamide of component (A1_4) here is formed on the basis of at least 75 mol %, more particularly of at least 80 mol %, of cycloaliphatic diamine and at least 80 mol %, preferably at least 90 mol %, more particularly at least 95 mol % of an aliphatic or aromatic dicarboxylic acid having 4 to 18 carbon atoms, preferably having 6-12 carbon atoms, and optionally further lactams and/or aminocarboxylic acids.

With particular preference the polyamides (A1_4) are formed from the following components:
(a) Dicarboxylic acids: 80-100 mol % of isophthalic acid, terephthalic acid, sebacic acid, dodecanedioic acid, based on the total amount of dicarboxylic acids present,
(b) Diamines: 80-100 mol % of at least one cycloaliphatic diamine having 6-36 carbon atoms, preferably having 12 to 20, more preferably 13 to 17 carbon atoms, based on the total amount of diamines present, 0-20 mol % of aliphatic diamines, preferably having 4 to 20 carbon atoms, the percentage molar amount of dicarboxylic acids making 100% and the percentage molar amount of diamines making 100% in the high-melting polyamides, and optionally from:
(c) Aminocarboxylic acids and/or lactams, comprising lactams having preferably 6 to 12 carbon atoms, and/or aminocarboxylic acids having preferably 6 to 12 carbon atoms.

Whereas components (a) and (b) are used largely equimolarly, the concentration of (c) is not more than 40 wt %, preferably not more than 35 wt %, more particularly not more than 30 wt %, based in each case on the sum of (a) to (c).

Additionally to the largely equimolarly employed components and, it is possible to use dicarboxylic acids or diamines to regulate the molar mass or to compensate losses of monomer during polyamide production, meaning that in its entirety the concentration of one component may predominate.

As cycloaliphatic diamines it is possible for example to use cyclohexanediamine, 1,3-bis(aminomethyl)-cyclohexane (BAC), isophoronediamine, norbornane-dimethylamine, 4,4'-diaminodicyclohexylmethane (PACM), 2,2-(4,4'-diaminodicyclohexyl)propane (PACP), and 3,3'-dimethyl-4,4'-diaminodicyclohexylmethane (MACM), EACM, TMDC. Araliphatic diamines that may be mentioned include m-xylylenediamine (MXDA) and p-xylylenediamine (PXDA).

Additionally to the dicarboxylic acids and diamines described it is possible to use, as well, lactams and/or aminocarboxylic acids as polyamide-forming components. Suitable compounds are, for example, caprolactam (CL), α,ω-aminocaproic acid, α,ω-aminononanoic acid, α,ω-aminoundecanoic acid (AUA), laurolactam (LL), and α,ω-aminododecanoic acid (ADA). The concentration of the aminocarboxylic acids and/or lactams used together with the components (A1a) and (A1b) is not more than 20 wt %, preferably not more than 15 wt %, and more preferably not more than 12 wt %, based on the sum of the components (A1a) to (A1c). Especially preferred are lactams and/or α,ω-amino acids having 4, 6, 7, 8, 11 or 12 C atoms. These are the lactams pyrrolidin-2-one (4 C atoms), ε-caprolactam (6 C atoms), enantholactam (7 C atoms), caprylolactam (8 C atoms), laurolactam (12 C atoms), and, respectively, the α,ω-amino acids 1,4-aminobutanoic acid, 1,6-aminohexanoic acid, 1,7-aminoheptanoic acid, 1,8-aminooctanoic acid, 1,11-aminoundecanoic acid, and 1,12-aminododecanoic acid. In one particularly preferred embodiment, component (A2) is free from caprolactam and/or aminocaproic acid.

Component (A1_4) is preferentially selected from the group consisting of polyamide PA MACM12, PA MACMI/12, PA MACMT/MACMI/12.

In order to regulate the molar mass, the relative viscosity and/or the fluidity or the MVR it is possible to admix the batch and/or the precondensate (prior to the postcondensation) with chain transfer agents in the form of monocarboxylic acids or monoamines. Aliphatic, cycloaliphatic or aromatic monocarboxylic acids or monoamines with chain transfer agent suitability are acetic acid, propionic acid, butyric acid, valeric acid, caproic acid, lauric acid, stearic acid, 2-ethylhexanoic acid, cyclohexanoic acid, benzoic acid, 3-(3,5-di-tert-butyl-4-hydroxyphenyl)propanoic acid, 3,5-di-tert-butyl-4-hydroxybenzoic acid, 3-(3-tert-butyl-4-hydroxy-5-methylphenyl)propanoic acid, 2-(3,5-di-tert-butyl-4-hydroxybenzylthio)acetic acid, 3,3-bis(3-tert-butyl-4-hydroxyphenyl)butanoic acid, butylamine, pentylamine, hexylamine, 2-ethylhexylamine, n-octylamine, n-dodecylamine, n-tetradecylamine, n-hexadecylamine, stearylamine, cyclohexylamine, 3-(cyclohexylamino)-propylamine, methylcyclohexylamine, dimethylcyclohexylamine, benzylamine, 2-phenylethyl-amine, 2,2,6,6-tetramethylpiperidin-4-amine, 1,2,2,6,6-pentamethylpiperidin-4-amine, 4-amino-2,6-di-tert-butylphenol, etc. The chain transfer agents can be utilized individually or in combination. It is also possible to use, as chain transfer agents, other monofunctional compounds which are able to react with an amino group or acid group, such as anhydrides, isocyanates, acid halides, or esters. The typical amount in which the chain transfer agents are used is between 10 and 200 mmol per kg of polymer.

With regard to a polymer mixture comprising the polyamide components A1, the following compositions are preferred:
(A1_1): PA 610 or PA 612 or PA 1010 or PA 1012 or PA 1210 or PA1212 or PA 11 or PA 12
(A1_3): PA 6T/6I or PA 10T/10I, where the 6I and/or 10I fraction is 55-80 (preferably 60-75) mol %.
(A1_1): PA 66 or PA6 or a mixture of PA 6 and PA66, in a ratio of 1:1 to 1:4, more particularly in a ratio of 1:3 to 1:4;
(A1_3): PA 6I/6T, where the molar ratio is in the range from 65:35 to 75:25, or especially is 67:33.
(A1_1): PA 66 or PA 610 or PA 612 or PA 1010 or PA 1012 or PA 1210 or PA1212 or PA 11 or PA 12
(A1_3): PA MXD6/MXDI, where the molar ratio in the copolyamide is in the range from 70:30 to 90:10 or more particularly is 88:12.

Here preferentially the fraction of component (A1_1) in each case is in the range from 50 to 90 wt %, more particularly from 60 to 85 wt %, and component (A1_3)

preferably in the range from 10 to 50 wt %, more particularly in the range from 15 to 40 wt %.

With regard to a polymer mixture comprising the polyamide components A1_2 and A1_3, the following compositions are preferred:

(A1_2): PA 6T/10T (5 to 40/60-95 mol %)
(A1_3): PA 6I/6T or PA 10I/10T, where the molar ratio I:T is in the range from 55:45 to 75:25 or, more particularly, in the range from 60:40 to 70:30.
(A1_2): PA 6T/10T/6I;
(A1_3): PA 6I/6T or PA 10I/10T, where the molar ratio I:T is in the range from 55:45 to 75:25 or, more particularly, in the range from 60:40 to 70:30.
(A1_2): PA 6T/6I, where the molar ratio is in the range from 60:40 to 75:25;
(A1_3): PA 6I/6T, where the molar ratio is in the range from 65:35 to 75:25 or, more particularly, is 67:33.
(A1_2): PA6T/10T (5 to 40/60-95 mol %)
(A1_3): PA MXD6/MXDI, where the molar ratio in the copolyamide is in the range from 70:30 to 90:10 or more particularly is 88:12.

Here preferentially the fraction of component (A1_2) in each case is in the range from 50 to 90 wt %, more particularly from 60 to 85 wt %, and component (A1_3) preferably in the range from 10 to 50 wt %, more particularly in the range from 15 to 40 wt %, based in each case on component (A1) as a whole.

Component (B) (LDS additive): The fraction of component (B) is preferably in the range of 2-8 wt %, more preferably in the range of 2-6 wt %.

Component (B) is preferably an LDS additive having a nonzero absorption coefficient for UV, VIS or IR radiation, which on exposure to electromagnetic radiation, preferably in the form of laser radiation, forms metal seeds which, in a chemical metallizing procedure, facilitate and/or enable and/or enhance the deposition of metal layers for the generation of conductor tracks at the irradiated locations on the surface of the molding, the LDS additive preferably having a capacity for absorption in the visible and infrared radiation regions, with an absorption coefficient of at least 0.05, preferably at least 0.1 and more particularly at least 0.2, and/or an absorber is provided which transmits the radiant energy to the LDS additive.

Component (B) is preferably an LDS additive having an average particle size (D50) in the range of 50-10000 nanometers, preferably 200 to 5000 nanometers and more preferably 300 to 4000 nanometers, and/or having an aspect ratio of not more than 10, more particularly not more than 5. The D50 value, stated as a measure of the particle size, is a measure of the average particle size, with 50 volume percent of the sample being finer, and the other 50% of the sample coarser, than the D50 value (median).

In one preferred embodiment component (B) comprises an LDS (Laser Direct Structuring) additive selected from the group of the metal oxides, more particularly those known as spinels with the general chemical formula

where M is a metal cation of valence 2, with M preferably being selected from the group consisting of the following: magnesium, copper, cobalt, zinc, tin, iron, manganese and nickel, and also combinations thereof;
X is a metal cation of valence 3, with X preferably being selected from the group consisting of the following: manganese, nickel, copper, cobalt, tin, titanium, iron, aluminum, and chromium, and also combinations thereof;

with more particular preference, the LDS additive is a copper iron spinel, a copper-containing magnesium aluminum oxide, a copper chromium manganese mixed oxide, a copper manganese iron mixed oxide, optionally in each case with oxygen defects, or salts and oxides of copper, such as, in particular, copper(I) oxide, copper(II) oxide, basic copper phosphates, copper hydroxide phosphate, copper sulfate, and also metal complex compounds, more particularly chelate complexes of copper, tin, nickel, cobalt, silver, and palladium, or mixtures of such systems, and/or selected more particularly from the following group: copper chromium manganese mixed oxides, copper manganese iron mixed oxides, copper chromium oxide, zinc iron oxide, cobalt chromium oxide, cobalt aluminum oxide, magnesium aluminum oxide, and also mixtures and/or surface-treated forms thereof, and/or forms thereof that have oxygen defects. Possible for example are systems as described in WO-A-2000/35259 or in Kunststoffe 92 (2002), 11, 2-7, for example.

Likewise preferred as component (B) is an LDS (Laser Direct Structuring) additive selected from the group of the metal oxides, mixed metal oxides, metal hydroxide oxides, metal sulfide oxides based on tin. Particular preference is given to tin oxide, antimony oxide, mixtures of tin oxide and antimony oxide, bismuth neodymate ($Bi_2O_3.Nd_2O_3$), copper molybdate ($CuO.xMoO_3$), mixtures of tin oxide and indium oxide, mixtures of tin oxide and tin fluoride.

Particularly preferred is tin oxide and doped tin oxide, in which case the doping may be with antimony, bismuth, molybdenum, aluminum, titanium, silicon, iron, copper, silver, nickel and cobalt. Preference more particularly is given to tin oxide doped with antimony, titanium or copper. Preference extends to mixtures of tin oxide and at least one further metal oxide, more particularly antimony oxide, as LDS additive. Further metal oxides used in this context are not only colorless metal oxides of high refractive index, such as titanium dioxide, antimony(III) oxide, zinc oxide, tin oxide, cerium oxide and/or zirconium dioxide, in particular, but also colored metal oxides such as, for example, chromium oxide, nickel oxide, copper oxide, cobalt oxide, and especially iron oxide ($Fe_2O_3$, $Fe_3O_4$). More particular preference is given to using the mixture of tin oxide and antimony(III) oxide.

The doped tin oxides and/or metal oxide mixtures or tin oxide are formed preferably as layers on platelet-shaped substrates, more particularly phyllosilicates, such as, for example, synthetic or natural mica, talc, kaolin, glass platelets or silicon dioxide platelets.

Preferred substrates for the metal oxides are, in particular, mica or mica flakes. Other substrates contemplated include platelet-shaped metal oxides such as, for example, platelet-shaped iron oxide, aluminum oxide, titanium dioxide, silicon dioxide, LCPs (Liquid Crystal Polymers), holographic pigments or coated graphite platelets.

Furthermore, component (C) is preferably selected from phosphates, condensed phosphates, phosphonates, phosphites, and mixed hydroxide-phosphate oxo anions of copper (Cu), tin (Sn), and/or iron (Fe), more particularly from metal phosphates, basic metal phosphates or metal hydroxide phosphates, preferably based on inorganic compounds of copper and/or of tin, more particularly tritin phosphate (CAS 15578-32-3), tricopper phosphate (CAS 7798-23-4), copper diphosphate (CAS 10102-90-6), copper hydroxide phosphate (CAS 12158-74-6), copper tin phosphate, and mixtures thereof.

Particularly preferred are the LDS additives basic copper phosphate, copper hydroxide phosphate, copper tin phosphate, basic copper tin phosphate, tin phosphate, basic tin phosphate, and antimony-doped tin oxide, the latter being used preferably in combination with mica. Particular preference is given to LDS additives based on mica, the mica surface being coated with metal-doped tin oxides, since the latter permit greater color brightness in the molding composition. Especially preferred is antimony-doped tin oxide. Examples of commercially available LDS additives in accordance with the present invention are as follows: Iriotec 8820, 8825, 8830 and Minatec 230 A-IR from Merck, Stanostat CP40W, Stanostat CP15G or Stanostat CP5C from Keeling&Walker.

Component (B) may therefore be an LDS additive selected from the following group: doped tin oxides, preferably antimony doped tin oxides; metal oxide mixtures with tin oxide, in the form of layers on platelet-shaped substrates, especially phyllosilicates, such as preferably synthetic or natural mica, talc, kaolin, glass platelets or $SiO_2$ platelets; metal-doped or metal oxide-doped tin oxide; metal oxide-coated mica; mica coated with antimony-doped tin oxide; mixture of tin oxide and antimony oxide and optionally further metal oxides; copper chromium oxide; copper oxide; copper hydroxide; copper hydroxide phosphate; copper phosphate; basic copper phosphates; copper tin phosphates; basic copper tin phosphate; tin phosphate; basic tin phosphate; or a mixture of such LDS additives.

The particularly preferred LDS additives are as follows: copper chromite, copper hydroxyl phosphate, and antimony-doped tin oxide, the latter finding use preferably in combination with mica.

Preferably the fraction of component (C) is in the range of 0.5-50 wt %, preferably in the range of 1-40 wt %, and more preferably in the range of 1-30 wt % or 2-25 wt %. Component (C) here is preferably composed of particulate fillers (C1) and/or compatibilizers or impact modifiers (C2) and/or fibrous fillers (C3) and/or additives (C4).

Particulate fillers (C1) of component (C) that are contemplated include the fillers known per se to the skilled person. These include, in particular, particulate fillers selected from the group consisting of talc (magnesium silicate), mica, silicates, quartz, wollastonite, kaolin, silicas, magnesium carbonate, magnesium hydroxide, chalk, ground or precipitated calcium carbonate, lime, feldspar, inorganic pigments, such as, for example, iron oxide or iron manganese oxide or, in particular, white pigments, such as barium sulfate, zinc oxide, zinc sulfide, lithopones and titanium dioxide (rutile, anatase), permanent-magnetic or magnetizable metals or alloys, hollow-sphere silicate fillers, aluminum oxide, boron nitride, boron carbide, aluminum nitride, calcium fluoride, glass beads, hollow glass spheres and mixtures thereof. The fillers may also be in surface-treated form.

(C1) preferentially has an average particle size (D50) in the range of 0.1-40 µm, preferably in the range of 0.1-20 µm, more particularly in the range of 0.1-10 µm. These particulate fillers (component C1) preferentially have an average particle size (D50) in the range of 0.1-40 µm, preferably in the range of 0.2-20 µm, more particularly in the range of 0.3-10 µm. Preference is given to a form of the particulate fillers wherein the aspect ratios L/w1 and L/w2 are both not more than 10, more particularly not more than 5, the aspect ratios being described by the ratio of greatest length L of the particle to its average width w1 or w2. Here, w1 and w2, which are disposed perpendicularly to one another, are located in a plane which is perpendicular relative to the length L.

Used as component (C2) are compatibilizers or impact modifiers based on modified polyolefins, rubber, EPDM, vinylaromatic polymers, polyolefin-co-(meth)acrylate copolymers or polyphenylene ethers. The component (C2) preferentially possesses constituents having acid anhydride groups, which are introduced by thermal or radical reaction of the main-chain polymer with an unsaturated dicarboxylic anhydride, an unsaturated dicarboxylic acid or an unsaturated dicarboxylic monoalkyl ester, in a concentration sufficient for effective attachment to the polyamide, with reagents selected from the following group being used preferentially for this purpose: maleic acid, maleic anhydride, maleic monobutyl ester, fumaric acid, aconitic acid and/or itaconic anhydride.

Particularly preferred are copolymers of butadiene with styrene that are functionalized by grafting with maleic anhydride; apolar or polar olefin homopolymers and copolymers formed by grafting with maleic anhydride; and carboxylic acid-functionalized copolymers such as poly(ethene-co-(meth)acrylic acid) or poly(ethene-co-1-olefin-co(meth)acrylic acid) in which some of the acid groups are neutralized with metal ions.

Fibrous reinforcing agents (C3), more particularly glass fibers, can be used in the range of 0-30, preferably 1-20, and more preferably in the range of 2-15 wt %, based on the overall molding composition.

Glass fibers (component C3) may be used, for example, in the form of short fibers (e.g., chopped glass with a length of 0.2-20 mm) or continuous fibers (rovings).

The glass fibers may have different cross-sectional areas, with preference being given to glass fibers with a circular cross section (round fibers) and with a noncircular cross section (flat fibers).

Glass fibers with a circular cross section, i.e., round glass fibers, have a diameter in the range of 5-20 µm, preferably in the range of 6-13 µm, and more preferably in the range of 6-10 µm. They are employed preferably in the form of short glass fiber (chopped glass with a length of 0.2 to 20 mm, preferably 2-12 mm).

In the case of the flat glass fibers, these being glass fibers with a noncircular cross-sectional area, preference is given to using those having a dimension ratio of the principal cross-sectional axis to the secondary cross-sectional axis situated perpendicular thereto of more than 2.5, preferably in the range from 2.5 to 6, more particularly in the range from 3 to 5. These so-called flat glass fibers preferably have an oval, elliptical, constricted elliptical (cocoon fiber), polygonal, rectangular or virtually rectangular cross-sectional area.

Component (C3) is preferably selected from the group consisting of the following: E glass fibers (which according to ASTM D578-00 consist of 52-62% silicon dioxide, 12-16% aluminum oxide, 16-25% calcium oxide, 0-10% borax, 0-5% magnesium oxide, 0-2% alkali metal oxides, 0-1.5% titanium dioxide and 0-0.3% iron oxide; they preferably have a density of 2.58±0.04 g/cm$^3$, a modulus of elasticity in tension of 70-75 GPa, a tensile strength of 3000-3500 MPa, and an elongation at break of 4.5-4.8%), A glass fibers (63-72% silicon dioxide, 6-10% calcium oxide, 14-16% sodium and potassium oxides, 0-6% aluminum oxide, 0-6% boron oxide, 0-4% magnesium oxide), C glass fibers (64-68% silicon dioxide, 11-15% calcium oxide, 7-10% sodium and potassium oxides, 3-5% aluminum oxide, 4-6% boron oxide, 2-4% magnesium oxide), D glass fibers (72-75% silicon dioxide, 0-1% calcium oxide; 0-4% sodium and potassium oxides, 0.1% aluminum oxide, 21-24% boron oxide), basalt fibers (mineral fiber with the approximate composition: 52% $SiO_2$, 17% $Al_2O_3$, 9% CaO, 5% MgO, 5% $Na_2O$, 5% iron oxide, and further metal oxides), AR glass fibers (55-75% silicon dioxide, 1-10% calcium oxide, 11-21% sodium and potassium oxides, 0-5% aluminum oxide, 0-8% boron oxide, 0-12% titanium dioxide, 1-18% zirconium oxide, 0-5% iron oxide), and mixtures thereof.

The glass fibers of the invention may be provided with a size which is suitable for thermoplastics, more particularly for polyamide, comprising an adhesion promoter based on an aminosilane or epoxysilane compound.

Additives of component (C4): The thermoplastic polyamide molding compositions of the invention may further comprise adjuvants which are common knowledge to the skilled person, in the form of the additives (C2), which are selected preferably from the group consisting of the following: adhesion promoters, halogen-containing flame retardants, halogen-free flame retardants, stabilizers, aging inhibitors, antioxidants, antiozonants, light stabilizers, UV stabilizers, UV absorbers, UV blockers, inorganic heat stabilizers, especially based on copper halides and alkali metal halides, organic heat stabilizers, conductivity additives, carbon black, optical brighteners, processing assistants, nucleating agents, crystallization accelerators, crystallization retarders, flow assistants, lubricants, mold release agents, plasticizers, organic pigments, organic dyes, marker substances, and mixtures thereof.

Further embodiments are specified in the dependent claims.

Preferred embodiments of the invention are described below with reference to the drawings, which serve merely for elucidation and should not be interpreted restrictively.

The FIGURE shows the parameters of the laser structuring.

DESCRIPTION OF PREFERRED EMBODIMENTS

The invention is to be described hereinafter using specific working examples (B), and compared with the less highly performing systems of the prior art (VB). The working examples specified below serve to support the invention and to demonstrate the differences relative to the prior art, but they are not intended to limit the general subject matter of the invention, as it is defined in the claims.

Examples B1 to B11 and Comparative Examples VB1-VB3

The components specified in Tables 2a, 2b and 3 are compounded in a twin-screw extruder from Werner and Pfleiderer having a screw diameter of 25 mm, with specified processing parameters (see Table 1); the polyamide pellets along with the adjuvants are metered into the intake zone, while the glass fibers optionally used are metered into the polymer melt via a side feeder 3 barrel units ahead of the die. The compounded formulations were taken off in the form of an extruded strand, from a die having a diameter of 3 mm, and were pelletized after water cooling. After pelletizing and drying at 110° C. for 24 hours, the properties of the pellets were measured and the test specimens were produced.

TABLE 1

Conditions for compounding, injection molding and foil extrusion for the examples and comparative example

| Processing | Parameter | Unit | B1-B11, VB3 | VB1, VB2 |
|---|---|---|---|---|
| Compounding | Barrel temperatures | ° C. | 250-260 | 260-280 |
|  | Screw speed | rpm | 200 | 200 |
|  | Throughput | kg/h | 15 | 15 |
| Injection molding | Barrel temperatures | ° C. | 265-280 | 265-280 |
|  | Mold temperature | ° C. | 80 | 130 |
|  | Melt temperature |  | 280 | 275 |
| Foil extrusion | Barrel temperature | ° C. | 220-265 | 260-275 |
|  | Melt temperature | ° C. | 250-260 | 265-275 |
|  | Screw speed | r/min | 60 | 60 |
|  | Takeoff rate | m/min | 5.8 | 5.8 |
|  | Takeoff roll temperature | ° C. | 60-62 | 70-72 |

Processing:

The compounded formulations were injected on an Arburg Allrounder 320-210-750 injection-molding machine to give specimens at defined barrel temperatures for zones 1 to 4 and at a defined mold temperature (see Table 1). The molding produced by injection molding in the form of a plate for comparative example VB3 and example B11 had a thickness of 2 mm; the thickness of the ISO test specimens was 4 mm.

In example B11, the foil B7 (thickness 100 μm) for the individual test specimens was cut to an exact fit and placed against the inner wall of the mold cavity, bearing against it over its full area. The foil was then in-mold-coated under the conditions specified in table 1 with the molding composition specified in table 3.

The foils were produced on a single-screw extruder for examples B1 to B11 and VB1 or on a Dr. Collin GmbH E 30 flat-film coextrusion unit (e.g. VB2) having one (two) 30 mm 3-zone screw(s). The foils were produced using a slot die/multilayer die. The dimensions of the foil were 200 mm width or 250 mm and 100 μm thickness. The foils were wound up using a chill roll and cut to the required length. The further production parameters can be seen in table 1.

TABLE 2a

Composition and properties of examples B1-B7

|  | Unit | B1 | B2 | B3 | B4 | B5 | B6 | B7 |
|---|---|---|---|---|---|---|---|---|
| Composition | | | | | | | | |
| PA1010 moderate viscosity | % wt | 85.8 | 76.3 | 76.3 |  |  |  |  |
| PA1010 high viscosity | % wt |  |  |  | 76.3 |  |  |  |
| PA6I/6T | % wt | 9.5 | 19 |  |  |  | 95.3 |  |
| PA10I/10T | % wt |  |  | 19 | 19 |  |  |  |

TABLE 2a-continued

Composition and properties of examples B1-B7

| | Unit | B1 | B2 | B3 | B4 | B5 | B6 | B7 |
|---|---|---|---|---|---|---|---|---|
| Composition | | | | | | | | |
| PA12 | % wt | | | | | 57.3 | | |
| PAMACM12 | % wt | | | | | 38 | | 95.3 |
| Nucleation | % wt | 0.2 | 0.2 | 0.2 | 0.2 | 0.2 | 0.2 | 0.2 |
| LDS additive | % wt | 4 | 4 | 4 | 4 | 4 | 4 | 4 |
| Irganox 1098 | % wt | 0.5 | 0.5 | 0.5 | 0.5 | 0.5 | 0.5 | 0.5 |
| Properties | | | | | | | | |
| Modulus of elasticity in tension | MPa | 2100 | 2200 | 2000 | 2000 | 1500 | 2900 | 1600 |
| Tensile strength | MPa | 56 | 61 | 59 | 61 | 59 | 90 | 62 |
| Elongation at break | % | 35 | 40 | 140 | 50 | 230 | 10 | 120 |
| Impact strength 23° C. | kJ/m$^2$ | no break | no break | no break | no break | no break | 50 | no break |
| Notched impact strength 23° C. | kJ/m$^2$ | 8 | 5 | 5 | 6 | 7 | 9 | 9 |
| Planarity of foil | | | | | | | | |
| after foil production | — | + | + | + | + | + | + | + |
| after laser structuring | — | 0 | 0 | 0 | 0 | + | + | + |
| after metallization | — | 0 | − | − | 0 | + | − | + |
| Detachment of the metal layer on 10-fold roll-up (d = 10 mm) | — | no | no | no | no | no | no | no |
| Metallizability (proportion of metalized fields) | % | 86 | 100 | 100 | 100 | 100 | 94 | 100 |

TABLE 2b

Composition and properties of examples B8-B10 and VB1, VB2

| | Unit | B8 | B9 | B10 | VB1 | VB2 |
|---|---|---|---|---|---|---|
| Composition | | | | | | |
| PA1010 high viscosity | % wt | 50 | | | | |
| PA12 | % wt | | 35.5 | 45.5 | | |
| PA MACM12 | % wt | 45.5 | 60 | | | |
| PA MACMI/12 | % wt | | | 50 | | |
| PET | % wt | | | | 75 | |
| PA6I/6T | % wt | | | | 20 | |
| Aluminum oxide | % wt | | | | 1 | |
| LDS additive | % wt | 4 | 4 | 4 | 4 | |
| Irganox 1098 | % wt | 0.5 | 0.5 | 0.5 | | |
| Properties | | | | | | |
| Modulus of elasticity in tension | MPa | 2000 | 1550 | 2000 | 3400 | |
| Tensile strength | MPa | 60 | 60 | 65 | 90 | |
| Elongation at break | % | 180 | 190 | 160 | 15 | |
| Impact strength 23° C. | kJ/m$^2$ | no break | no break | no break | no break | |
| Notched impact strength 23° C. | kJ/m$^2$ | 7 | 10 | 8 | 4 | |
| Planarity of foil | | | | | | |
| after foil production | | + | + | + | + | + |
| after laser structuring | | + | + | + | 0 | 0 |
| after metallization | | + | + | + | − | − |
| Detachment of the metal layer on 10-fold roll-up (d = 10 mm) | — | no | no | no | no | Detachment at the edges |
| Metallizability (proportion of metalized fields) | % | 100 | 100 | 100 | 75 | 63 |

In comparative example VB2 a 3-layer foil with the layer sequence ABA, layer A being a 5 to 10 μm layer of VB1 and the middle layer B being an 80 to 90 μm layer of PET (with no additions), was subjected to the laser structuring and subsequent electroless metallization, without the foil having been drawn and heat-set beforehand. The foil, which was smooth after extrusion, underwent warping during laser irradiation and became highly corrugated.

TABLE 3

Composition and properties of examples B11 and VB3

|  | Unit | VB3 Moldings produced by injection molding | B11 Moldings produced by in-mold-coating of foil B7 |
|---|---|---|---|
| Composition of injection molding or in-mold-coated thermoplastic | | | |
| PA1010 | wt % | 36.6 | 36.6 |
| PA6I/6T | wt % | 9.1 | 9.1 |
| Glass fibers | wt % | 50 | 54 |
| LDS additive | wt % | 4 | 0 |
| Irganox 1098 | wt % | 0.3 | 0.3 |
| Properties | | | |
| Modulus of elasticity in tension | MPa | 12900 | 14500 |
| Tensile strength | MPa | 139 | 187 |
| Elongation at break | % | 2.0 | 2.8 |
| Impact strength 23° C. | kJ/m² | 50 | 95 |
| Notched impact strength 23° C. | kJ/m² | 9 | 20 |
| Metallizability (proportion of metalized fields) | % | 100 | 100 |
| Amount of LDS additive relative to molding (60 × 60 × 2 mm plate)*⁾ | wt % | 4.0 | 0.2 |

*⁾The plate in B11 has dimensions of 60 × 60 × 2 mm, with a surface formed by foil B7 (thickness 0.1 mm).

Materials:

| PA 6I/6T (70:30) | Amorphous, semiaromatic polyamide based on terephthalic acid, isophthalic acid and 1,6-hexanediamine, with a glass transition temperature of 125° C. and a solution viscosity of 1.54. |
|---|---|
| PA 10I/10T (60:40) | Amorphous, semiaromatic polyamide based on 1,10-decanediamine, isophthalic acid and terephthalic acid, with a glass transition temperature of 101° C. and a solution viscosity of 1.59. |
| PA 1010 | Semicrystalline, aliphatic polyamide based on 1,10-decanediamine and sebacic acid, having a melting point of 200° C. and a solution viscosity of 1.78 (medium viscosity) or 2.06 (high viscosity). |
| PA 12 | Semicrystalline, aliphatic polyamide based on laurolactam, having a melting point of 178° C. and a solution viscosity of 1.96. |
| MACM12 | Amorphous polyamide based on MACM and DDDS, Tg = 156° C., ηrel = 1.82, ΔHm < 4 J/g, LT = 93%. |
| MACMI/12 | Amorphous polyamide based on MACM, isophthalic acid and lactam 12; Tg = 155° C., ηrel = 1.86, ΔHm < 4 J/g |
| Glass fibers | Chopped glass fibers CSG3PA-820 of E glass, with a length of 3 mm, a principal cross-sectional axis of 28 μm, a secondary cross-sectional axis of 7 μm and an axial ratio of 4 (noncircular cross section) from NITTO BOSEKI, Japan |
| LDS additive | Shepherd Black 30C965 (The Shepherd Color Company), copper chromite ($CuCr_2O_4$), average particle size 0.6 μm. |
| Nucleation | Brüggolen P22, Brüggermann Chemical |
| PET | Polyethylene terephthalate having a standard viscosity SV (dichloroacetic acid) of 800 |
| Aluminum oxide | Aerosil 90, Evonik |

Measurements:

The measurements were carried out according to the following standards on the following test specimens. The modulus of elasticity in tension was determined in accordance with ISO 527 at a tensioning speed of 1 mm/min, the yield stress, breaking strength and elongation at break in accordance with ISO 527 with a tensioning speed of 50 mm/min (unreinforced versions) or with a tensioning speed of 5 mm/min (reinforced versions) at a temperature of 23° C., the specimen used being an ISO tensile rod, standard: ISO/CD 3167, type A1, 170×20/10×4 mm.

Impact strength and Charpy notched impact strength were measured according to ISO 179 on the ISO test rod, standard: ISO/CD 3167, type B1, 80×10×4 mm at 23° C. temperature.

The thermal characteristics (melting temperature (Tm), enthalpy of fusion (ΔHm), glass transition temperature (Tg)) were determined on the pellets in accordance with ISO standard 11357-11-2. Differential scanning calorimetry (DSC) was carried out with 20° C./min heating rate. For the glass transition temperature (Tg), the temperature for the middle stage or for the point of inflection is reported.

The relative viscosity (ηrel) was measured in accordance with DIN EN ISO 307 on 0.5 wt % strength solutions in m-cresol at 20° C. Pellets are the sample used.

Laser Structuring:

To assess the metallization performance, injection moldings in VB3 and B11 (plate 60×60×2 mm or, for example B11, the in-mold-coated foil B7 in the same dimensions 60×60×2 mm) and also foil sections with dimensions of 60×60×0.1 mm for examples B1 to B10 were structured using an Nd:YAG laser and afterward subjected to electroless metallization in a copperizing bath. For the laser structuring, 32 adjacent regions measuring 4×4 mm were irradiated on the surface of the molding. Laser structuring took place using a Trumpf TruMark Station 5000 laser at a wavelength of 1064 nm. The rate was varied in the range from 300 to 7200 mm/s, the pulse frequency in the range of 10-80 kHz, and the hatch (pulse overlap) in the range from 0.03 to 0.09 mm (see the FIGURE). Following the laser structuring, the moldings are subjected to a cleaning operation in order to remove the residues from the laser process. In this procedure, the moldings passed through successively ultrasound baths containing surfactant and deionized water. After cleaning, the moldings are metalized in succession in reductive copperizing baths (MID Copper 100 XB Strike and MID Copper 100 XB Build, MacDermid) at 55 to 65° C. The residence time here is 20 min in the strike bath and 1-3 h in the build bath. The rate of copper deposition (thickness of the copper layer) in the MID Copper 100 XB Build bath on the laser-irradiated areas averages 3 to 5 μm/h.

Metallizability:

The metallizability was calculated as the ratio of metalized fields to the total number of fields, and reported as a percentage fraction. In total 32 fields having different parameters per sample plate, as shown in the FIGURE, are structured with the laser and then metalized as described above. Metalized fields are only the fields metalized uniformly and completely in the procedure described above.

In all MID technologies, chemically reductive copper deposition is the key initial metallizing operation, and determines the quality of the layer as a whole. It is therefore completely sufficient for the quality of the primary metal layer to be assessed. In order to arrive at the completed MID part, building on the first copper layer (primary layer), generally nickel and then a final layer of immersion gold are deposited. Of course other metal layers as well, such as further layers of copper, palladium, tin or silver, may also be applied to the primary layer.

Planarity:

The foils are assessed for their planarity by inspection, using foil sections with dimensions of 60×60×0.1 mm or 150×150×0.1 mm, as used for the laser structuring, with assessment taking place in each case after foil production, after laser structuring, and after metallization. Foil planarity is characterized as follows:

+: foil lies flat on a smooth surface and at no point in the foil plane has visible elevations or depressions; in other words, the foil is flat.

o: foil does not lie flat on a smooth surface and in the foil plane clearly has a number of elevations or depressions which occupy a multiple of the foil thickness; overall or in the region treated with the laser, the foil is corrugated.

−: foil is severely corrugated or has clear three-dimensional deformation.

Summary of Results:

The compositions listed for B1 to B10 (tables 2a and b) can be readily processed by extrusion to give smooth, speck-free foils having a thickness of 100 micrometers. The mechanical properties determined on ISO specimens show that for these molding compositions, elongation at break and impact strength are high and breaking strength is good. The foils can all be structured and metalized to good or very good effect, without the thin foils becoming damaged. It was also found that the metal layer applied electrolessly to the foils possesses very good adhesion to the foil material. Accordingly, the metalized foils can be rolled up multiply to give a roll having a diameter (d) of less than or equal to 10 mm without any observation of detachment or visible damage to the metal layer. The foils in experiments B5, B7 and B8-B10 retain their planarity, moreover, after laser structuring and metallization, whereas other foils, especially those of VB1 and VB2, undergo warping as early as during laser structuring, or at the latest during metallization, becoming corrugated and so completely losing their flat form.

Table 3 contains the comparison between an injection molding containing the LDS additive throughout (VB3) and a molding of the same size produced by in-mold-coating of the foil B7 (example B11), which contains the LDS additive in a thin surface micrometers thick. The layer formed from the in-mold-coated plastic is free from LDS additives. The in-mold-coated foil adheres very well and over the full area to the in-mold-coated plastic, making the foil layer impossible to detach without destruction. The molding produced by in-mold-coating has significantly better mechanical properties. Thus for inventive example B11, with a higher modulus of elasticity, the breaking strength is 35%, the elongation at break is 40%, the impact strength is 90%, and the notched impact strength is more than 100% higher than for VB3, and with equally good metallizability on the part of the molding. A further advantage of B11 is the much lower level of LDS additive required for the production of laser-structurable moldings of this kind. Overall, based on the molding, much less LDS additive is necessary for B11, specifically just 1/20 of the LDS additive amount for VB3 in order to achieve equally good metallizability on the part of the molding.

The invention claimed is:

1. A process for producing a laser-structurable component,
   wherein an extruded, single-layer or multilayer molding in the form of a laser-structurable foil with a thickness in the range of 10-100 micrometers that forms an exposed surface of the molding is in mold-coated with a non-laser-structurable thermoplastic carrier element, so that at least one laser-structurable foil forms at least one part of the surface of the laser-structurable component, with or without having already formed conductor tracks,
   the laser-structurable foil of the molding consisting substantially over its entire area of a thermoplastic molding composition consisting of:
   (A) 30-99.9 wt % of thermoplastic consisting of polyamide (A1), wherein (A1) consists of:
      an amorphous semiaromatic polyamide (A1_3);
      a cycloaliphatic amorphous polyamide (A1_4); or
      a mixture of an aliphatic polyamide (A1_1) and at least one of a semiaromatic, semicrystalline polyamide (A1_2) or an amorphous semiaromatic polyamide (A1_3) or an cycloaliphatic amorphous polyamide (A1_4); or of a mixture of said polyamide (A1) and another thermoplastic (A2),
      the fraction of polyamide (A1) being at least 70 wt %, based on the sum of (A1) and (A2);
   (B) 0.1-10 wt % of LDS additive; and
   (C) 0-25 wt % of adjuvants different from (A) and (B), composed of compatibilizers or impact modifiers and/or additives (C4),
      wherein said additives (C4) are selected from the group consisting of: adhesion promoters, halogen-containing flame retardants, halogen-free flame retardants, stabilizers, aging inhibitors, antioxidants, antiozonants, light stabilizers, UV stabilizers, UV absorbers, UV blockers, inorganic heat stabilizers, organic heat stabilizers, conductivity additives, carbon black, optical brighteners, processing assistants, nucleating agents, crystallization accelerators, crystallization retarders, flow assistants, lubricants, mold release agents, plasticizers, organic pigments, organic dyes, marker substances, and mixtures thereof;
   the sum of (A)-(C) making 100 wt %.

2. The process as claimed in claim 1, wherein the at least one laser-structurable foil of the molding is designed without having already formed conductor tracks.

3. The process as claimed in claim 1, wherein the molding is introduced as a foil in a mold and is coated by the carrier element in the mold.

4. The process as claimed in claim 1, wherein the carrier element contains polyamide.

5. The process as claimed in claim 1, wherein the cycloaliphatic amorphous polyamide (A1_4) is constructed from:
   a) 60 to 100 mol %, of at least one aliphatic and/or aromatic dicarboxylic acid having 6 to 14 carbon atoms, and also 0 to 40 mol %, of at least one cycloaliphatic dicarboxylic acid having 8 to 20 carbon atoms, based on the total amount of the dicarboxylic acids;
   b) 50 to 100 mol %, of at least one cycloaliphatic diamine selected from PACM, MACM, EACM, TMDC, BAC and IPD, and also 0 to 50 mol %, of at least one aliphatic diamine, having 4-18 carbon atoms, based on the total amount of diamines, and also optionally; and c) aminocarboxylic acids and/or lactams each having 6 to 12 carbon atoms.

6. The process as claimed in claim 1, wherein the polyamide (A1) consists of 20-100 wt %, of amorphous cycloaliphatic polyamide (A1_4) and of 0-80 wt %, of aliphatic polyamide (A1_1) and/or semicrystalline, semiaromatic polyamide (A1_2).

7. The process as claimed in claim 1, wherein conductor tracks are formed on the component in one of the following operating steps on the component, by laser direct structuring and subsequent electroless deposition, and also, optionally, electrical and/or electronic components are subsequently incorporated.

8. The process as claimed in claim 1, wherein the molding is a foil formed by the laser-structurable layer alone, or having one or more carrier layers which are different from the laser-structurable layer and on which one or more carrier layers a laser structurable layer is disposed on one or both sides, forming the surface.

9. The process as claimed in claim 1, wherein the molding is a foil, having a thickness in the range of 40-100 micrometers, and the foil being formed by the laser-structurable layer alone, or having one or more carrier layers which are different from the laser-structurable layer and on which one or more carrier layers a laser structurable layer is disposed on one or both sides, forming the surface.

10. The process as claimed in claim 1, wherein the carrier element and/or, the molding consist of a mixture of a polyamide (A1) and another thermoplastic (A2), the fraction of polyamide (A1) being at least 70 wt % based on the sum of (A1) and (A2), wherein the amount of component (A1_1), based on the sum of the components (A1_1), (A1_2), (A1_3) and (A1_4), is in the range from 40 to 95 wt %, and/or wherein component (A1_1) is selected from the group consisting of the following: polyamide PA610, PA106, PA1010, PA1012, PA1212, PA11, PA12, or mixtures or copolyamides thereof; and/or wherein component (A1_2) is selected from the group consisting of the following: PA 4T/4I, PA 4T/6I, PA 5T/5I, PA 6T/6, PA 6T/6I, PA 6T/6116, PA 6T/66, 6T/610, 6T/612, PA 6T/10T, PA 6T/10I, PA 9T, PA 10T, PA 12T, PA 10T/10I, PA10T/106, PA10T/12, PA10T/11, PA 6T/9T, PA 6T/12T, PA 6T/10T/6I, PA 6T/6116, PA 6T/61112, and also mixtures or copolyamides thereof; and/or wherein component (A1_3) is selected from the group consisting of the following: 6I/6T, 10I/10T, 12/6T, MXD6/MXDI, and also mixtures or copolyamides thereof; and/or wherein component (A1_4) is selected from the group consisting of the following: polyamide PA MACM12, PA MACMI/12, PA MACMT/MACMI/12, MACM9, MACM10, MACM14, MACM16, MACM18, PACM12, PACM14, PACM16, PACM18, MACM12/PACM12, MACM14/PACM14, MACM16/PACM16, MACM18/PACM18, PACM9 18, 6I/6T/MACMI/MACMT/12, 6I/MACMI/MACMT, 6I/PACMI/PACMT, 6I/6T/MACMI, MACMI/MACM36, 12/PACMI or 12/MACMT, 6I/PACMT, 6/IPDT, BACI/BACT, MACM12/BAC12, 10I/10T/BACI/BACT, or mixtures or copolyamides thereof.

11. The process as claimed in claim 1, wherein the fraction of amorphous cycloaliphatic polyamide (A1_4) is in the range of 20-100 wt % and the fraction of aliphatic polyamide (A1_1) is in the range of 0-80 wt %.

12. The process as claimed in claim 1, wherein the cycloaliphatic amorphous polyamide (A1_4) is constructed from a) 80 to 100 mol %, of at least one aliphatic and/or aromatic dicarboxylic acid having 6-12 carbon atoms, and also 0 to 20 mol %, of at least one cycloaliphatic dicarboxylic acid having 8 to 20 carbon atoms, based on the total amount of the dicarboxylic acids;

b) 85 to 100 mol % of at least one cycloaliphatic diamine, having 6 to 20 carbon atoms, selected from PACM, MACM, EACM, TMDC, BAC and IPD, and also 0-15 mol % of at least one aliphatic diamine, having 6 to 12 carbon atoms, based on the total amount of diamines, and also optionally;

c) aminocarboxylic acids and/or lactams each having 6 to 12 carbon atoms.

13. The process as claimed in claim 1, wherein the polyamide (A1) consists of 35-80 wt % of amorphous cycloaliphatic polyamide (A1_4) and of 20-65 wt % of at least one of an aliphatic polyamide (A1_1).

* * * * *